US008642235B2

(12) United States Patent
Veselinovic et al.

(10) Patent No.: US 8,642,235 B2
(45) Date of Patent: Feb. 4, 2014

(54) METHOD OF OPTIMIZING A DIE SIZE, METHOD OF DESIGNING A PATTERN DEVICE MANUFACTURING METHOD, AND COMPUTER PROGRAM PRODUCT

(75) Inventors: Petar Veselinovic, Eindhoven (NL); Frank Bornebroek, Eindhoven (NL); Paul Jacques Van Wijnen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 2 days.

(21) Appl. No.: 13/482,419

(22) Filed: May 29, 2012

(65) Prior Publication Data

US 2012/0308921 A1    Dec. 6, 2012

Related U.S. Application Data

(60) Provisional application No. 61/491,587, filed on May 31, 2011.

(51) Int. Cl.
*G03C 5/00*    (2006.01)
*G03F 1/00*    (2012.01)

(52) U.S. Cl.
USPC ............... 430/30; 430/5; 716/54; 716/55

(58) Field of Classification Search
USPC ..................... 430/5, 30; 716/54, 55
See application file for complete search history.

(56) References Cited

U.S. PATENT DOCUMENTS 6,368,761 B1    4/2002  Chien et al.
2004/0207824 A1    10/2004  Lof et al.

FOREIGN PATENT DOCUMENTS

JP    H11-274053    10/1999
JP    2003-518784    6/2003

OTHER PUBLICATIONS

Chen-Fu Chien et al., "Optimize Die Size Design to Enhance OWE for Design for Manufacturing," ISSM paper: DM-P-091, pp. 1-4, (2007).
Amos Dor et al., "WAMA—A method of optimizing reticle/die placement to increase litho cell productivity," Proc. of SPIE, vol. 5756, pp. 405-412 (2005).

*Primary Examiner* — Christopher Young
(74) *Attorney, Agent, or Firm* — Pillsbury Winthrop Shaw Pittman LLP

(57) ABSTRACT

A method of optimizing a die size in a method of manufacturing devices using a lithographic apparatus, wherein the lithographic apparatus is arranged to expose an image field of variable size in a single exposure step, the image field having a certain maximum size, the method comprising: receiving a desired area for the die; and calculating a target aspect ratio for the die, wherein the target aspect ratio is determined so as to maximize the number of good dies that can be imaged per hour using the lithographic apparatus. Desirably, calculating a target aspect ratio comprises finding a first target aspect ratio that maximizes a figure of merit MF, where MF is the ratio of the number of dies exposed in each image field divided by the number of exposures on each substrate.

20 Claims, 7 Drawing Sheets

METHOD OF OPTIMIZING A DIE SIZE, METHOD OF DESIGNING A PATTERN DEVICE MANUFACTURING METHOD, AND COMPUTER PROGRAM PRODUCT

This application claims priority and benefit under 35 U.S.C. §119(e) to U.S. Provisional Patent Application No. 61/491,587, entitled "Method of Optimizing a Die Size, Method of Designing a Pattern Device Manufacturing Method, and Computer Program Product", filed on May 31, 2011. The content of that application is incorporated herein in its entirety by reference.

FIELD

The present invention relates to a method of optimizing a die size, a method of designing a die, a device manufacturing method, and a computer program product.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Most lithographic processes for manufacture of semi-conductor integrated circuits print onto substrates that are circular wafers cut from a single crystal of a semiconductor material, e.g. silicon. Semiconductor devices are generally rectangular in plan and the image field of the lithographic apparatus is also rectangular. Generally, a die is smaller than the image field of a lithographic apparatus however it is possible for the die to be larger than the image field. In that case, multiple exposures are joined by a process known as "stitching". Therefore, it is a non-trivial problem to optimize the placement of rectangular dies within rectangular image fields so as to maximize the number of good devices that can be manufactured on a wafer. Although the problem is to some extent reduced as wafer sizes increase—300 mm wafers are now standard, 450 mm wafers are proposed—the capital and operating costs of lithographic apparatus are sufficiently high that productivity improvements of even a few percent are worth seeking.

U.S. Pat. No. 6,368,761 discloses a computer-based procedure for maximizing the number of dies that can be produced from a single wafer by consideration of the position of alignment marks and other fixed features of the wafer. A "cost-effectiveness ratio" is used to determine whether or not an exposure that would print only a small number of dies should be carried out.

The article "Optimize Die Size Design to Enhance OWE for Design for Manufacturing" by Chen-Fu Chien et al. (ISSM paper: DM-P-091, 2007) discloses a data mining approach to determining optimum die sizes and/or aspect ratios to achieve a goal of printing as many dies on each wafer as possible and reducing exposure times.

"WAMA—A method of optimizing reticle/die placement to increase litho cell productivity" by A. Dor et al, (Proceedings of SPIE Vol 5756, 2005) discloses a method of maximizing yield by controlling the positioning of dies when using a stepper by referring to a map of the yield potential of every point on the wafer.

SUMMARY

It is desirable, for example, to further improve the productivity of a lithographic apparatus and device manufacturing processes.

According to an aspect of the invention, there is provided a method of optimizing a die size in a method of manufacturing devices using a lithographic apparatus, wherein the lithographic apparatus is arranged to expose an image field of variable size in a single exposure step, the image field having a certain maximum size, the method comprising:

receiving a desired area for the die; and calculating a target aspect ratio for the die, wherein the target aspect ratio is determined so as to maximize the number of good dies that can be imaged per hour using the lithographic apparatus.

According to an aspect of the invention, there is provided a method of designing a pattern to be used to form a layer of a device in a method of manufacturing devices using a lithographic apparatus, wherein the lithographic apparatus is arranged to expose an image field of variable size in a single exposure step, the image having a certain maximum size, the method comprising:

determining a desired area for a die to expose the pattern;

calculating a target aspect ratio for the die, wherein the target aspect ratio is determined so as to maximize the number of good dies that can be imaged per hour using the lithographic apparatus; and designing the pattern to fit within a die of the desired area and having the target aspect ratio.

According to an aspect of the invention, there is provided a method of manufacturing devices using a lithographic apparatus, wherein the lithographic apparatus is arranged to expose an image field of variable size in a single exposure step, the image field having a certain maximum size, the method comprising:

determining a desired area for a die to expose a pattern for forming a layer of the device;

calculating a target aspect ratio for the die, wherein the target aspect ratio is determined so as to maximize the number of good dies that can be imaged per hour using the lithographic apparatus;

designing the pattern to fit within a die of the desired area and having the target aspect ratio; and exposing a substrate with the pattern a plurality of times to substantially fill the surface of the substrate with copies of the pattern.

According to an aspect of the invention, there is provided a computer program product comprising program code that when executed by a computer systems performs a method of optimizing a die size in a method of manufacturing devices using a lithographic apparatus, wherein the lithographic apparatus is arranged to expose an image field of variable size in a single exposure step, the image field having a certain maximum size, the method comprising:

receiving a desired area for the die; and calculating a target aspect ratio for the die, wherein the target aspect ratio is determined so as to maximize the number of good dies that can be imaged per hour using the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
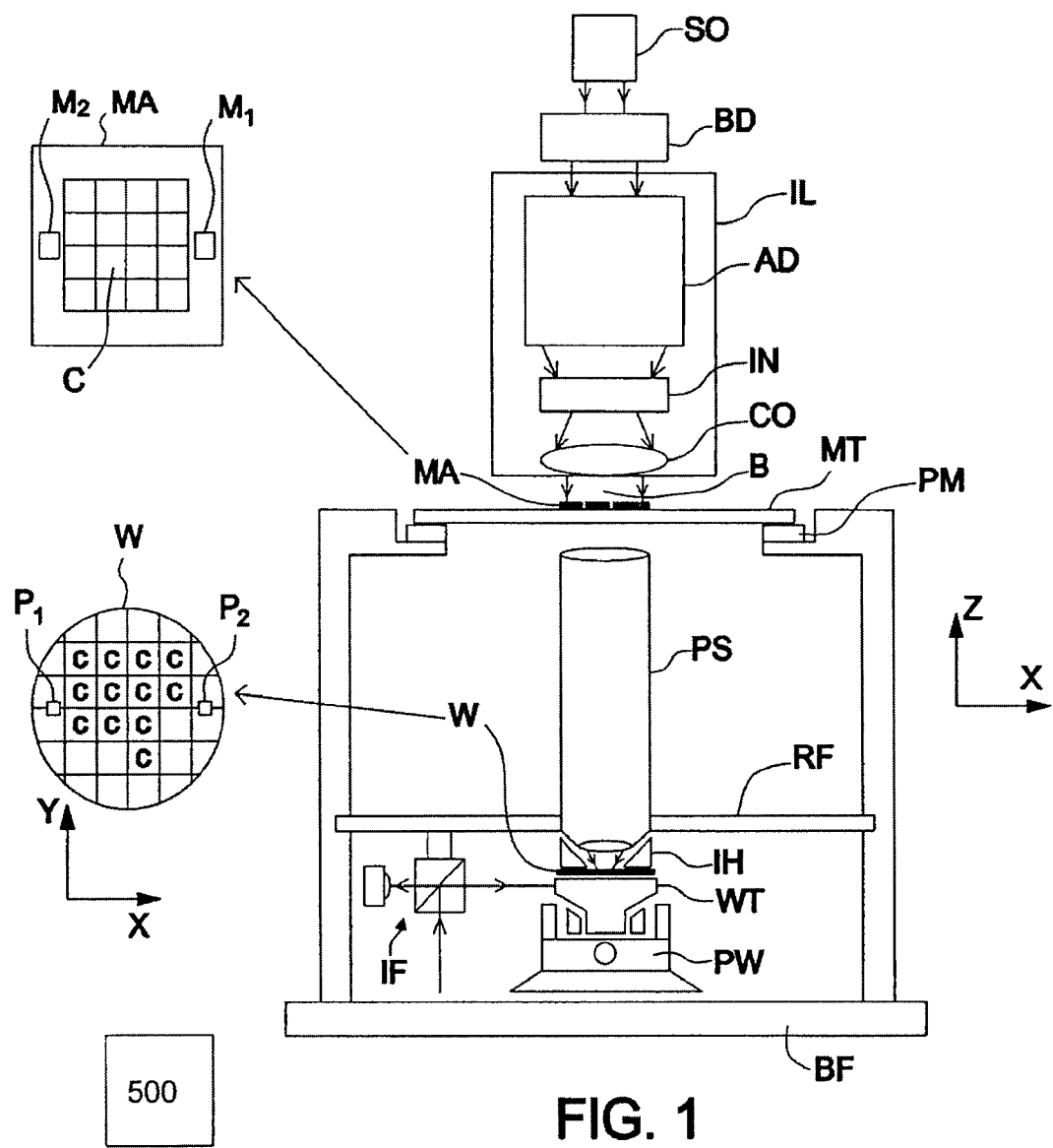
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus, a fluid, in particular a liquid, is provided between the final element of the projection system to enable imaging of smaller features and/or increase the effective NA of the apparatus. An embodiment of the invention is described further below with reference to such an immersion apparatus, but may equally be embodied in a non-immersion apparatus. Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Figure 2:
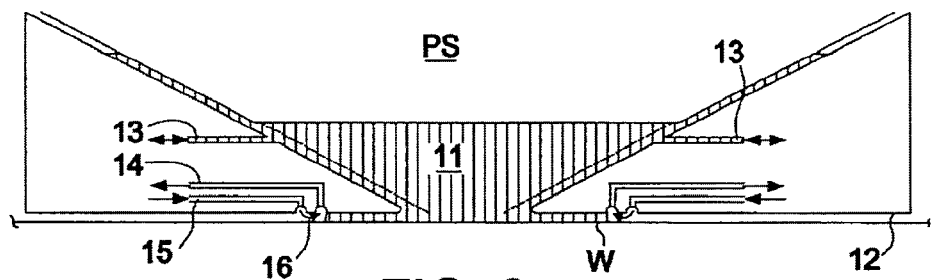
FIG. 2 depicts a liquid supply system for use in a lithographic projection apparatus.

An arrangement which has been proposed is to provide the liquid supply system with a liquid confinement member which extends along at least a part of a boundary of the space between the final element of the projection system and the substrate table. Such an arrangement is illustrated in FIG. 2. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13.

Many other types of liquid supply system are possible. The present invention is not limited to any particular type of liquid supply system, nor to immersion lithography. The invention can be applied equally in any lithography.

A control system 500 controls the overall operations of the lithographic apparatus and in particular performs an optimization process described further below. Control system 500 may be embodied as a suitably-programmed general purpose computer comprising a central processing unit and (volatile and/or non-volatile) storage. The control system may further include an input and output device such as a keyboard and screen, a connection to a network, and/or an interface to various parts of the lithographic apparatus. It will be appreciated that a one-to-one relationship between controlling computer and lithographic apparatus is not necessary. In an embodiment of the invention one computer may control multiple lithographic apparatuses. In another embodiment of the invention, multiple networked computers may be used to control one lithographic apparatus. The control system 500 may be configured to control one or more associated process devices and/or substrate handling devices in a lithocell or cluster of which the lithographic apparatus forms a part. The control system 500 may be configured to be subordinate to a supervisory control system of a lithocell or cluster and/or an overall control system of a fab.

Figure 3:
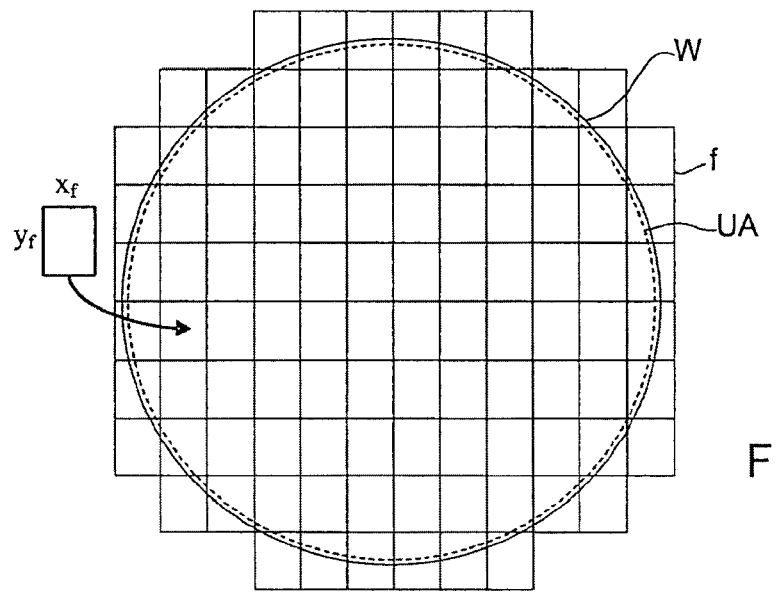
FIG. 3 depicts a circular substrate on which devices are to be formed in a method of an embodiment of the invention.

As shown in FIG. 3, a circular substrate (e.g. wafer) W has a usable area UA slightly smaller than its total surface area, allowing for an edge region that cannot be used to form devices. A standard substrate can have a nominal diameter of 150 mm, 200 mm, 300 mm or 450 mm, for example. At the time of writing, 300 mm is standard for silicon substrates and 450 mm is proposed. Small sizes are used for other semiconductor materials, such as GaAs. Larger sizes might be introduced in the future. The substrate can have a flat (not shown) or one or more notches (not shown) for coarse alignment purposes. The present invention is not limited to the use of a particular size or shape of substrate.

The image field f of a lithographic apparatus is generally rectangular. Each type of apparatus has maximum image field dimensions $X_{fmax}$ and $Y_{fmax}$ (at substrate level), e.g. 26 mm by 33 mm, but smaller images (having dimensions $X_f$ by $Y_f$) can be exposed by masking part of the patterning device with blades in the illuminator, by using a shorter scan than the maximum or by using an opaque (e.g. chrome) border in the patterning device. Standard shapes for masks or reticles are also rectangular. The imaging of the whole of the patterning device pattern onto an image field f on the substrate once is referred to as an exposure. In a stepper, the whole pattern is imaged in a single "flash". In a scanner only a part of the pattern is illuminated at a time and the patterning device and substrate are scanned to image the whole pattern. The invention applies to both steppers and scanners. As mentioned above, due to the demagnification of the projection system the patterning device pattern is 4 or 5 times larger than the image at substrate level. In the discussion of an embodiment of the invention, all dimensions are given at substrate level.

Figure 4:
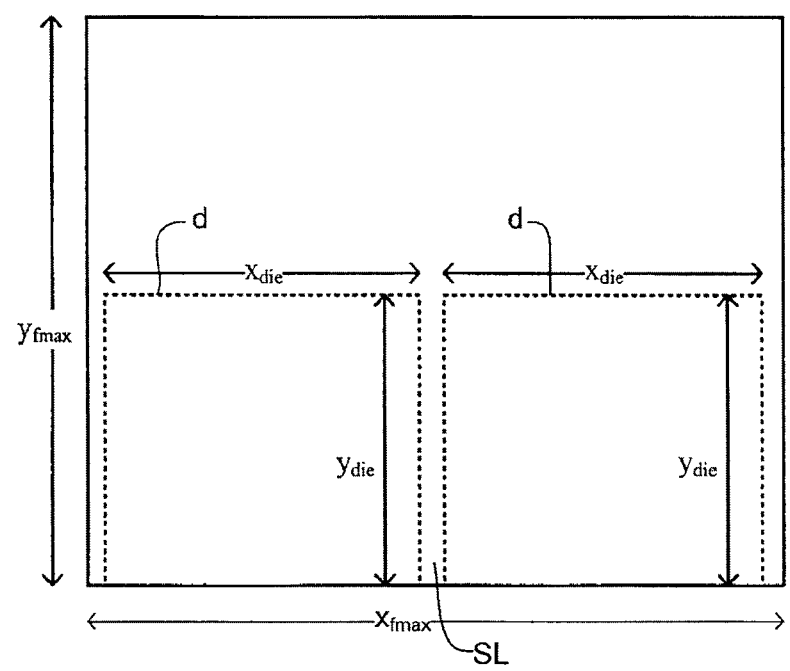
FIG. 4 is a diagram showing multiple dies within a single exposure field.

Conventionally, devices are also rectangular. FIG. 4 shows two dies d of dimensions, unless otherwise stated, of $X_{die}$ and $Y_{die}$ within an image field f. The size and shape of a device is determined by its functionality and the number and type of components required to provide that functionality. In some cases, the number of contacts that need to be made to the device sets a minimum perimeter length, since contacts are normally arranged around the edge of the device. It is also necessary to provide spaces between devices on the substrate, referred to as scribe lane SL. Although the scribe lanes are often used for alignment and other markers, the dimensions of the scribe lanes are generally set by the sawing or dicing technique that is to be used to separate the exposed substrate into discrete devices. If a device is small enough, multiple copies of a die can be included on a single patterning device so that multiple dies are imaged in each exposure.

Obviously, rectangular image fields f cannot be overlaid on a circular substrate without leaving gaps or overlapping the edge of the substrate. Although it may seem to be a waste of time, there are two reasons why it is often desirable to image edge fields, i.e. those fields that overlap the edge of the usable area of the substrate. The first reason is that if the patterning device includes multiple copies of the die, one or more dies of an edge field might fall within the usable area of the substrate and be properly imaged, even if one or more others do not. Thus the edge field might still result in good devices. Secondly, if no exposures are carried out in the edge fields, additive (e.g. deposition) and subtractive (e.g. etching) processes can result in significant level differences between the edge fields and the central fields. This can result in distortion of the substrate and non-uniform effects in subsequent processes. Thus it is common to expose all edge fields, in spite of the throughput loss in performing exposures that do not result in good devices.

Throughput optimization techniques have concentrated on maximizing the number of good dies that can be fitted onto a substrate by reference to geometric considerations. It is assumed that productivity is maximized by maximizing the number of devices produced per substrate. In some cases, consideration is given as to whether or not to expose edge fields. Chien et al (cited above) mentions the possibility of appropriate die size reducing exposure times per wafer and proposes a data mining technique to identify optimum die dimensions. However such an approach does not assist where new device criteria or new lithographic apparatus are to be employed and can only optimize die dimensions within the bounds of what has been tried in the past.

Accordingly an embodiment of the present invention provides a method of determining optimum dimensions for a die to be exposed by taking into account both geometric considerations of the substrate and dynamic properties or capabilities of the lithographic apparatus to be used. An embodiment of the present invention aims to maximize throughput of useful dies over a reasonable timescale, e.g. dies per hour. In some cases, highest productivity is obtained by reducing the number of dies per substrate in order to obtain a higher throughput of substrates per hour. In other cases, highest productivity is obtained by maximizing the number of dies per substrate, even at a cost in substrates per hour. In still other cases, a compromise between dies per substrate and substrates per hour produces highest productivity.

In an embodiment of the invention, a two step approach is taken. Given a fixed die area (and in some cases constraints as to minimum perimeter length), a first aspect ratio (ratio of die dimension in the x direction to die dimension in the y direction) is determined that maximizes the value of a merit function MF, where MF is the maximum number of dies that can be fitted into an exposure field no bigger than the largest exposure field that can be imaged by the lithographic apparatus, divided by the maximum number of exposures (just encompassing the number of dies) that can be fitted into the substrate. Thus the first aspect ratio is one that maximizes the number of dies per exposure and minimizes the number of exposures per substrate whilst substantially completely filling the substrate.

As a second step, a throughput model of the lithographic apparatus is used to fine-tune the aspect ratio. The throughput model is a mathematical model of the lithographic apparatus that seeks to predict as accurately as possible the throughput of the apparatus for a given process. The throughput model takes into account dynamic properties of the lithographic apparatus as well as parameters of the lithographic process. Parameters taken into account in the model can include: exposure field dimensions, scan speed set points, alignment marker placement, alignment processes, exposure routing, scan lengths, accelerations, etc. The fine tuning process can improve the productivity of the lithographic process by several percent, reducing the effective cost of ownership by an equivalent amount.

Once the final aspect ratio is determined, the device design can be created, or modified, to fit the determined aspect ratio. The different layers of the device are then exposed and processed. Finally, the substrate is separated into discrete devices, by cutting or sawing along the scribe lanes, by a known technique.

Figure 5:
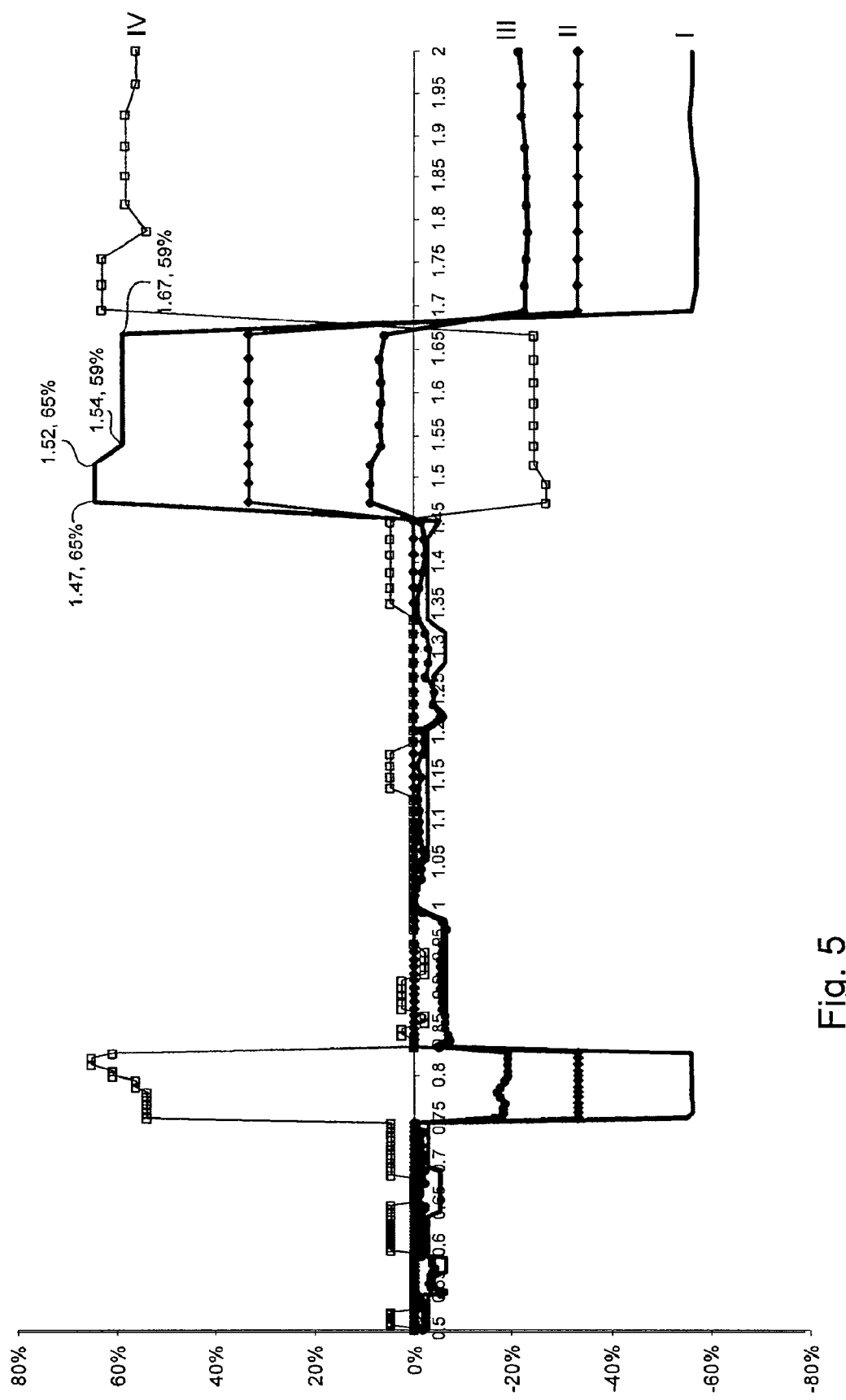
FIG. 5 is a graph showing the variation of various productivity parameters with aspect ratio for a die of area equal to 100 mm$^2$.

FIG. 5 is a graph showing results of applying a method according to an embodiment of the invention to an exemplary die having an area of 100 mm$^2$ on a 300 mm wafer and using a lithographic apparatus having a maximum image field of 26 mm by 33 mm. In the Figure, aspect ratio is plotted along the x (horizontal) axis and corresponding values of dies per field/fields per substrate (I—thick line), dies in each field (II—thin line with solid diamonds), dies per hour (III—thick line with solid circles) and fields per substrate (IV—thin line with open squares), all normalized to an aspect ratio of 1:1, are plotted on the y (vertical axis). As can be seen, the number of dies per field (I) is maximum over a fairly wide range of aspect ratios, from about 1.45 to about 1.7. In the same range there is a drop in the number of fields on the substrate and an increase in the number of dies per hour, compared to the figures obtained for a 1:1 aspect ratio die. However, a further increase in dies per hour can be seen in a relatively small range of aspect ratios where the fields per substrate is minimum, within the range for which dies per hour is maximum and the merit function MF—dies per field/fields per substrate—is maximum. Whilst the increase in this narrower range is only a few percent, such a productivity gain is highly valuable.

Figure 6:
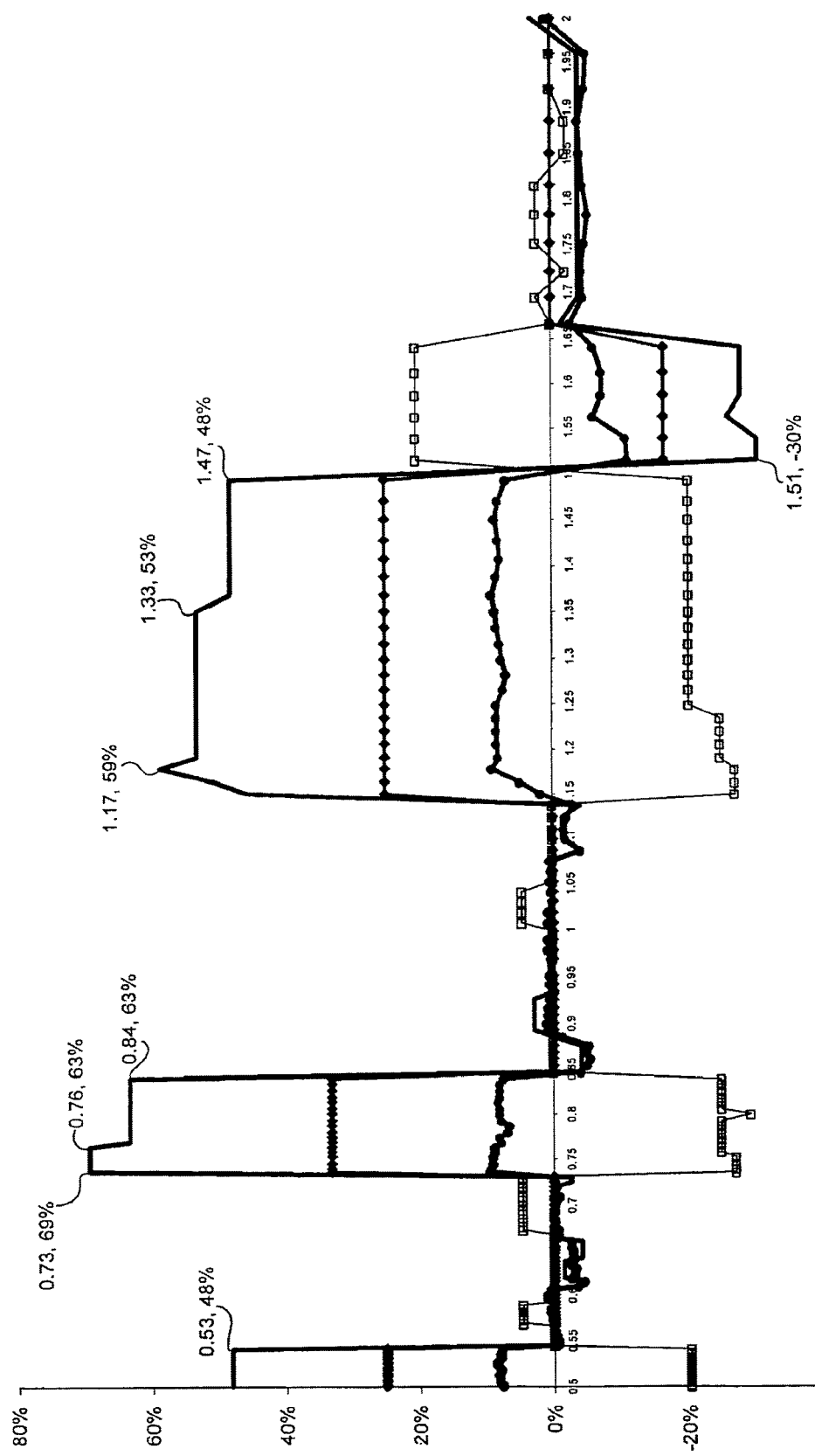
FIG. 6 is a graph similar to FIG. 5 for a die of 50 mm$^2$.
Figure 7:
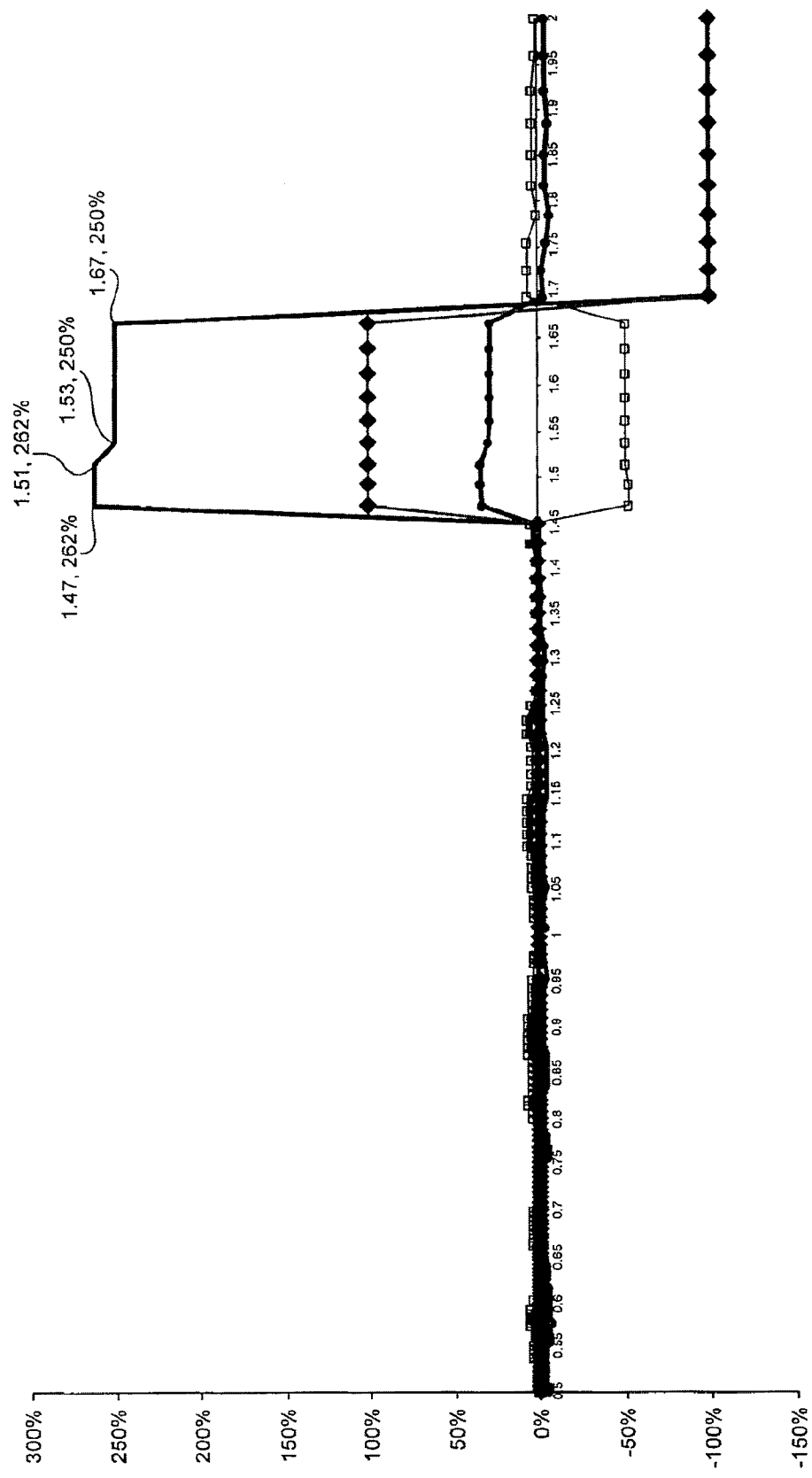
FIG. 7 is a graph similar to FIG. 5 for a die of 400 mm$^2$.

FIGS. 6 and 7 are graphs similar to FIG. 5 but for a die of size 50 mm$^2$ in FIG. 6 and 400 mm$^2$ in FIG. 7. Line patterns in FIGS. 6 and 7 correspond to FIG. 5. As with the 100 mm$^2$ dies, it can be seen in each case that the number of dies per field (I) is maximum over a fairly wide range of aspect ratios and within that range there is a drop in the number of fields on the substrate and an increase in the number of dies per hour, compared to the figures obtained for a 1:1 aspect ratio die. However, a further increase in dies per hour can be seen in a relatively small range of aspect ratios where the fields per substrate is minimum, within the range for which dies per hour is maximum and the merit function MF—dies per field/fields per substrate—is maximum. Optimization using the machine throughput model gives an optimum aspect ratio of 1.35 for 50 mm$^2$ dies and 0.67 for 400 mm$^2$ dies. In the latter case, there is limited design freedom as the die size means that it is only possible to fit 1 or 2 dies per exposure.

It will be appreciated that the above results are derived for a specific maximum exposure size and will scale according to the actual maximum exposure size of a lithographic apparatus in which an embodiment of the invention is applied.

Figure 8:
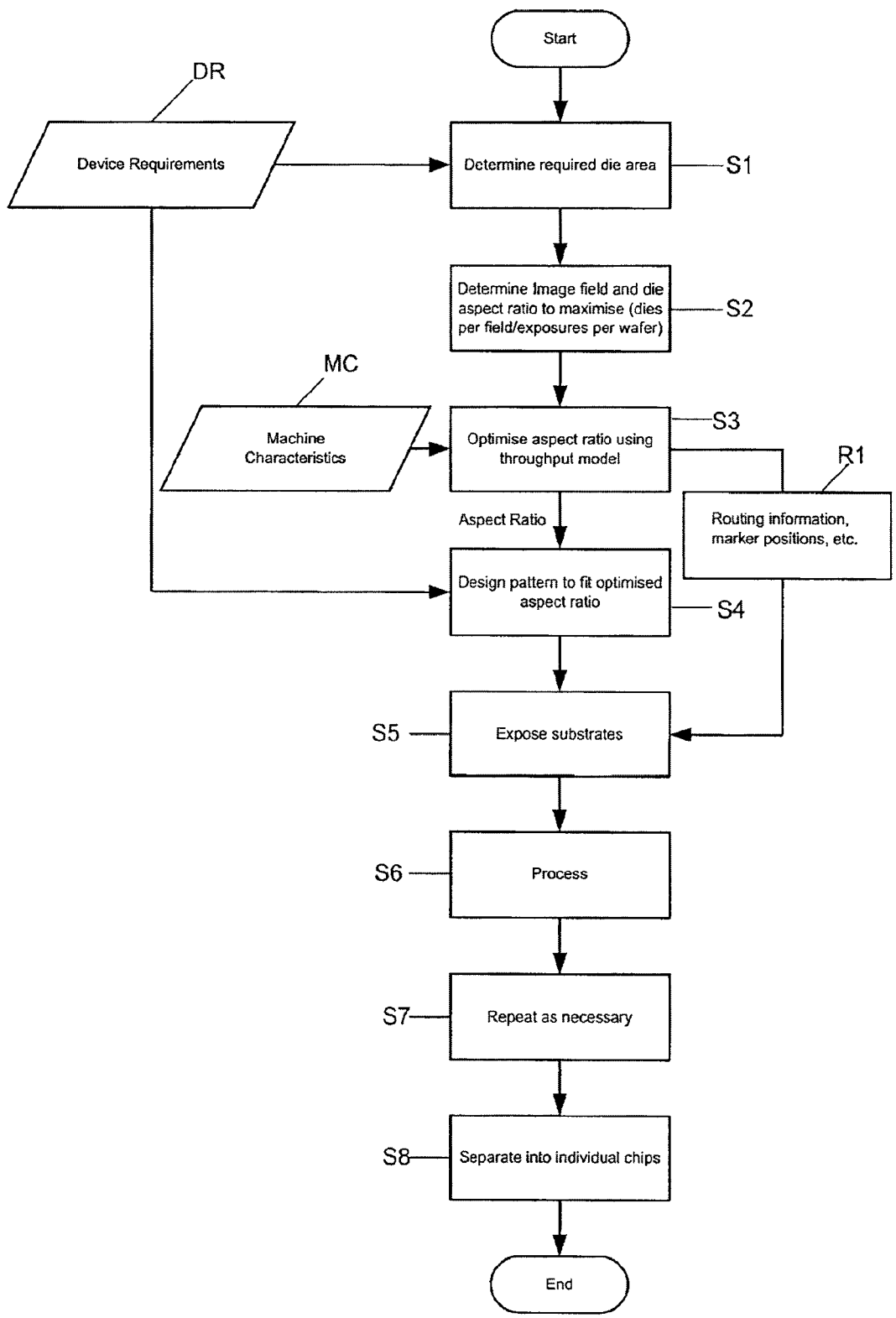
FIG. 8 depicts a method according to an embodiment of the invention.

FIG. 8 depicts a method according to an embodiment of the present invention. In step S1, device requirements DR are used to determine the required total die area. Next, an image field size and die aspect ratio are determined that maximize the merit function MF (dies per field divided by fields per substrate). In step S3, further optimization of the aspect ratio is performed using a throughput model. The throughput model is tailored to a specific lithographic apparatus and relies on information regarding machine characteristics MC. Using the or an aspect ratio determined using the merit function as the starting point for further optimization using a throughput model enables an optimized aspect ratio to be found quickly and can ensure that this optimization settles on a global rather than a local maximum. In this step, as well as the optimized aspect ratio, recipe information RI such as exposure routing and marker positions is also generated. In step S4, the device patterns are designed or modified to fit within the optimized aspect ratio. In step S5, substrates are exposed to the pattern using the routing information in the lithographic apparatus. Following an exposure the resist is developed and any necessary process steps applied, S6. The exposure and process steps S5 and S6 are repeated as necessary S7. Once all exposures and processes have been carried out, the devices are separated into individual chips S8 using a known sawing or dicing process.

Figure 9:
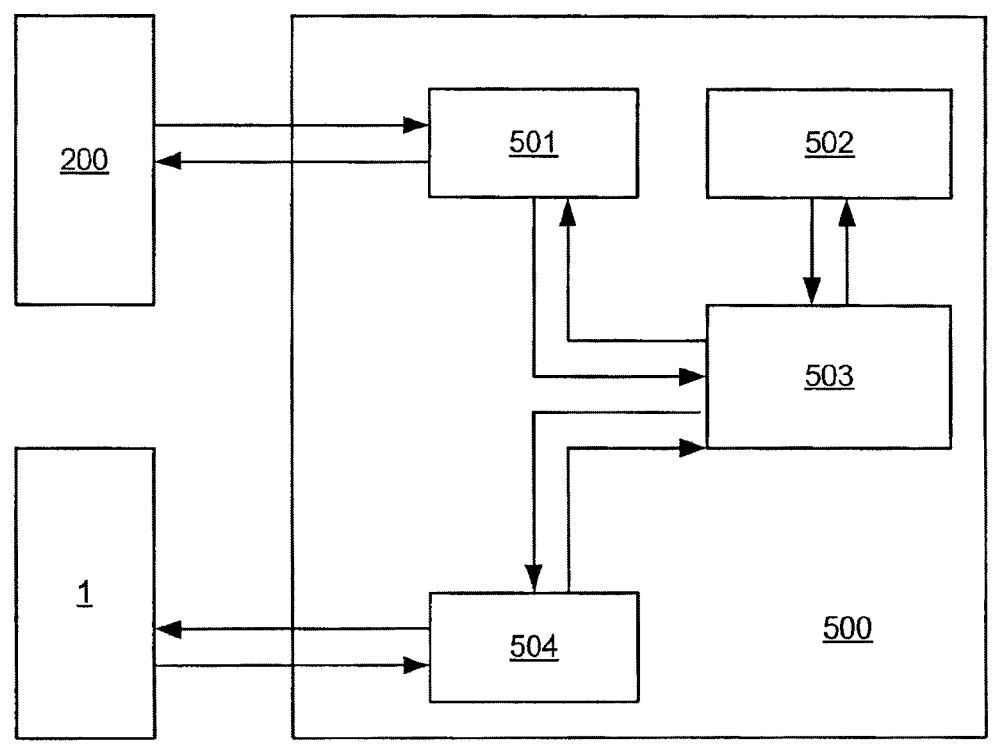
FIG. 9 depicts a control system according to an embodiment of the invention.

FIG. 9 depicts schematically a control apparatus 500 to perform a method according to an embodiment of the invention. Control apparatus 500 is interfaced to lithographic apparatus 1 and pattern design system 200 by interfaces 501, 504. Processor 503 carries out the method of an embodiment of the invention. Storage 502 stores device characteristics received from lithographic apparatus 1 and is referenced by the processor 503.

As will be appreciated, any of the above described features can be used with any other feature and it is not only those combinations explicitly described which are covered in this application.

Embodiments of the invention may be further described using the following clauses:

1. A method of improving a throughput of a lithographic apparatus, the lithographic apparatus being configured for imaging one or more dies located in an image field of the lithographic apparatus multiple times onto a substrate for substantially filling an exposure-surface of the substrate with images of the one or more dies, the method comprising:
determining a dimension of the image field for minimizing a number of exposures on the substrate to substantially fill the exposure-surface of the substrate while allowing sufficient area within the image field for the one or more dies.

2. The method of clause 1, wherein determining the dimension of the image field comprises determining the dimension of the image field as a trade-off between a maximum number of dies in the image field and a minimum number of exposures on the substrate to substantially fill the substrate.

3. The method of clause 1 or clause 2, further comprising determining a dimension of the one or more dies, wherein the dimension of the one or more dies is determined by maximizing the number of dies within the dimensions of the image field.

4. The method of clause 1 or 3, wherein determining the dimension of the image field comprises field-constraint parameters representing physical variation limits of the image field of the lithographic apparatus, and/or wherein determining the dimension of the one or more dies include die-constraint parameters representing physical variation limits of the dies.

5. The method of clause 2, wherein the trade-off is achieved by the following relationship:

$$\text{trade-off} = \max\left[\frac{(\max dies)/\text{field}}{(\min fields)/\text{substrate}}\right].$$

6. The method of clause 1, wherein determining the dimension of the image field comprises a throughput simulation model related to the lithographic apparatus.

7. The method of clause 6, wherein the throughput simulation model includes at least one of the following:
a speed of a substrate table for supporting the substrate;
an acceleration of the substrate table;
a scanning length of the lithographic apparatus; and/or
a scanning routing of the lithographic apparatus.

8. The method of clause 2, wherein maximizing the number of dies imaged on the substrate includes maximizing the number of dies on the substrate outside a predefined distance from the edge of the substrate.

9. The method of clause 2, wherein the substrate also comprises additional structures having a predefined placement tolerance and wherein maximizing the number of dies imaged on the substrate includes using the placement tolerance of the additional structures. Additional structures may, for example, be alignment structures—by moving such additional structures within their tolerance, additional space may be created and the number of good dies may be increased.

10. The method of clause 2, wherein the die comprises peripheral structures, and wherein maximizing the number of dies imaged on the substrate includes allowing at least a part of the peripheral structures to be placed inside a predefined distance from the edge of the substrate.

Embodiments of the invention may further be described using the following clauses:

11. A method of manufacturing devices using a lithographic apparatus, wherein the lithographic apparatus is arranged to expose an image field of variable size in a single exposure step, the image field having a certain maximum size, the method comprising:
determining a desired area for a die to expose a pattern for forming a layer of the device;
calculating a target aspect ratio for the die, wherein the target aspect ratio is determined so as to maximize the number of good dies that can be imaged per hour using the lithographic apparatus;
designing the pattern to fit within a die of the desired area and having the target aspect ratio; and
exposing a substrate with the pattern a plurality of times to substantially fill the surface of the substrate with copies of the pattern.

12. The method according to clause 11, further comprising separating the substrate into a plurality of discrete devices.

13. The method according to clause 11 or clause 12, wherein calculating the target aspect ratio takes account of a dynamic property of the lithographic apparatus.

14. The method according to clause 13, wherein the dynamic property of the lithographic apparatus is one or more properties selected from the group consisting of: scan speed, step speed, acceleration, scan length, exposure routing and substrate throughput.

15. The method according to any of clauses 11 to 14, wherein the die is smaller than the image field maximum size so that a plurality of dies can be exposed in a single exposure step.

16. The method according to clause 15, wherein calculating the target aspect ratio comprises finding a first target aspect ratio that maximizes a figure of merit MF, where MF is the ratio of the number of dies exposed in each image field divided by the number of exposures on each substrate.

17. The method according to clause 16, wherein calculating the target aspect ratio further comprises simulating exposure sequences using a throughput model and the first target aspect ratio to find a second target aspect ratio.

18. The method according to any of clauses 11 to 17, further comprising calculating a target image field for exposing the dies.

19. A computer program product comprising program code that when executed by a computer system performs a method of optimizing a die size in a method of manufacturing devices using a lithographic apparatus, wherein the lithographic apparatus is arranged to expose an image field of variable size in a single exposure step, the image field having a certain maximum size, the method comprising:
receiving a desired area for the die; and
calculating a target aspect ratio for the die, wherein the target aspect ratio is determined so as to maximize the number of good dies that can be imaged per hour using the lithographic apparatus.

20. The computer program product according to clause 19, wherein calculating the target aspect ratio takes account of a dynamic property of the lithographic apparatus.

21. The computer program product according to clause 20, wherein the dynamic property of the lithographic apparatus is one or more properties selected from the group consisting of: scan speed, step speed, acceleration, scan length, exposure routing and substrate throughput.

22. The computer program product according to any of clauses 19 to 21, wherein the die is smaller than the image field maximum size so that a plurality of dies can be exposed in a single exposure step.

23. The computer program product according to clause 22, wherein calculating the target aspect ratio comprises finding a first target aspect ratio that maximizes a figure of merit MF, where MF is the ratio of the number of dies exposed in each image field divided by the number of exposures on each substrate.

24. The computer program product according to clause 23, wherein calculating the target aspect ratio further comprises simulating exposure sequences using a throughput model and the first target aspect ratio to find a second target aspect ratio.

25. The computer program product according to any of clauses 19 to 24, further comprising calculating a target image field for exposing the dies.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of from 5 to 20 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

The descriptions above are intended to be illustrative, not limiting. Thus, it will be apparent to one skilled in the art that modifications may be made to the invention as described without departing from the scope of the claims set out below.

The invention claimed is:

1. A method of optimizing a die size in a method of manufacturing devices using a lithographic apparatus, wherein the lithographic apparatus is arranged to expose an image field of variable size in a single exposure step, the image field having a certain maximum size, the method comprising:
   receiving a desired area for the die; and
   calculating a target aspect ratio for the die,
   wherein the target aspect ratio is determined so as to maximize the number of good dies that can be imaged per hour using the lithographic apparatus.

2. The method according to claim 1, wherein calculating the target aspect ratio takes account of a dynamic property of the lithographic apparatus.

3. The method according to claim 2, wherein the dynamic property of the lithographic apparatus is one or more properties selected from the group consisting of: scan speed, step speed, acceleration, scan length, exposure routing and substrate throughput.

4. The method according to claim 1, wherein the die is smaller than the image field maximum size so that a plurality of dies can be exposed in a single exposure step.

5. The method according to claim 4, wherein calculating the target aspect ratio comprises finding a first target aspect ratio that maximizes a figure of merit MF, where MF is the ratio of the number of dies exposed in each image field divided by the number of exposures on each substrate.

6. The method according to claim 5, wherein calculating the target aspect ratio further comprises simulating exposure sequences using a throughput model and the first target aspect ratio to find a second target aspect ratio.

7. The method according to claim 1, further comprising calculating a target image field for exposing the dies.

8. A method of designing a pattern to be used to form a layer of a device in a method of manufacturing devices using a lithographic apparatus, wherein the lithographic apparatus is arranged to expose an image field of variable size in a single exposure step, the image field having a certain maximum size, the method comprising:
   determining a desired area for a die to expose the pattern;
   calculating a target aspect ratio for the die, wherein the target aspect ratio is determined so as to maximize the number of good dies that can be imaged per hour using the lithographic apparatus; and
   designing the pattern to fit within a die of the desired area and having the target aspect ratio.

9. The method according to claim 8, wherein calculating the target aspect ratio takes account of a dynamic property of the lithographic apparatus.

10. The method according to claim 9, wherein the dynamic property of the lithographic apparatus is one or more properties selected from the group consisting of: scan speed, step speed, acceleration, scan length, exposure routing and substrate throughput.

11. The method according to claim 8, wherein the die is smaller than the image field maximum size so that a plurality of dies can be exposed in a single exposure step.

12. The method according to claim 11, wherein calculating the target aspect ratio comprises finding a first target aspect ratio that maximizes a figure of merit MF, where MF is the ratio of the number of dies exposed in each image field divided by the number of exposures on each substrate.

13. The method according to claim 12, wherein calculating the target aspect ratio further comprises simulating exposure sequences using a throughput model and the first target aspect ratio to find a second target aspect ratio.

14. The method according to claim 8, further comprising calculating a target image field for exposing the dies.

15. A method of manufacturing devices using a lithographic apparatus, wherein the lithographic apparatus is arranged to expose an image field of variable size in a single exposure step, the image field having a certain maximum size, the method comprising:

determining a desired area for a die to expose a pattern for forming a layer of the device;

calculating a target aspect ratio for the die, wherein the target aspect ratio is determined so as to maximize the number of good dies that can be imaged per hour using the lithographic apparatus;

designing the pattern to fit within a die of the desired area and having the target aspect ratio; and exposing a substrate with the pattern a plurality of times to substantially fill the surface of the substrate with copies of the pattern.

16. The method according to claim 15, wherein the die is smaller than the image field maximum size so that a plurality of dies can be exposed in a single exposure step.

17. The method according to claim 16, wherein calculating the target aspect ratio comprises finding a first target aspect ratio that maximizes a figure of merit MF, where MF is the ratio of the number of dies exposed in each image field divided by the number of exposures on each substrate.

18. The method according to claim 17, wherein calculating the target aspect ratio further comprises simulating exposure sequences using a throughput model and the first target aspect ratio to find a second target aspect ratio.

19. A non-transitory computer program product comprising program code that when executed by a computer system performs a method of optimizing a die size in a method of manufacturing devices using a lithographic apparatus, wherein the lithographic apparatus is arranged to expose an image field of variable size in a single exposure step, the image field having a certain maximum size, the method comprising:

receiving a desired area for the die; and calculating a target aspect ratio for the die, wherein the target aspect ratio is determined so as to maximize the number of good dies that can be imaged per hour using the lithographic apparatus.

20. The computer program product according to claim 19, wherein calculating the target aspect ratio takes account of a dynamic property of the lithographic apparatus.

* * * * *